United States Patent [19]
Bohnert et al.

[11] Patent Number: 5,136,236
[45] Date of Patent: Aug. 4, 1992

[54] ARRANGEMENT FOR VOLTAGE MEASUREMENT IN A GIS INSTALLATION

[75] Inventors: Klaus Bohnert, Niederrohrdorf; Hubert Brändle, Otelfingen; Lutz Niemeyer, Birr; Roland Stierlin, Gränichen, all of Switzerland

[73] Assignee: Asea Brown Boveri Ltd., Baden, Switzerland

[21] Appl. No.: 584,715

[22] Filed: Sep. 19, 1990

[30] Foreign Application Priority Data

Sep. 25, 1989 [CH] Switzerland .................. 3461/89

[51] Int. Cl.$^5$ .................. G01R 31/00; G01R 19/00
[52] U.S. Cl. .................. 324/96; 324/117 R; 324/158 R; 250/227.14
[58] Field of Search .................. 324/158 R, 96, 126, 324/127, 109, 117 R, 72, 244; 174/11 BH, 142, 143; 336/174, 175; 250/227.14, 231 R

[56] References Cited

U.S. PATENT DOCUMENTS

| | | | |
|---|---|---|---|
| 3,829,742 | 8/1974 | Muller | 174/28 |
| 3,900,791 | 8/1975 | Kleen et al. | 174/28 |
| 3,938,039 | 2/1976 | Hermstein et al. | 324/96 |
| 4,320,337 | 3/1982 | Hartmann et al. | 324/126 |
| 4,617,513 | 10/1986 | Reinhart | 324/126 |
| 4,797,607 | 1/1989 | Dupraz | 324/96 |
| 4,929,830 | 5/1990 | Bohnert et al. | 324/96 |
| 4,939,447 | 7/1990 | Bohnert et al. | 324/96 |

FOREIGN PATENT DOCUMENTS

| | | |
|---|---|---|
| 0289791 | 11/1988 | European Pat. Off. . |
| 0316619 | 5/1989 | European Pat. Off. . |
| 0316635 | 5/1989 | European Pat. Off. . |
| 0356670 | 3/1990 | European Pat. Off. . |
| 659329 | 1/1987 | Switzerland . |

OTHER PUBLICATIONS

Applied Optics, vol. 19, No. 22, Nov. 15, 1980, A. Papp, et al., "Magnetooptical Current Transformer", pp. 3729–3734.
Appl. Phys. Lett., 34(11), Jun. 1, 1979, pp. 768–770.
S. C. Rashleigh, et al., "Magneto-Optic Current Sensing with Birefringent Fibers".
IEEE Journal of Quantum Electronics, vol. QE-18, No. 4, pp. 477–488, Apr. 4, 1982, D. N. Payne, et al., "Development of Low- and High-Birefringence Optical Fibers".
Optical and Quantum Electronics, 16, (1984), pp. 455–461, J. N. Ross, "The Rotation of the Polarization in Low Birefringence Monomode Optical Fibers Due to Geometric Effects".

*Primary Examiner*—Vinh Nguyen
*Attorney, Agent, or Firm*—Oblon, Spivak, McClelland, Maier & Neustadt

[57] ABSTRACT

In a gas-insulated switchgear having an isolated-phase bus, a current-carrying bus (2) with a given external radius $R_1$ is arranged coaxially in a cylindrical enclosure with a given external radius $R_2$, the voltage of the current carrying bus is measured using optical fiber voltage transducers. For this purpose, at least three identical piezoelectric sensor elements are provided. They are arranged essentially at a distance corresponding to the internal radius $R_2$ from an axis of the current carrying bus in the enclosure at identical angular distances. The sensor elements are preferably accommodated together with an optical fiber curent transducer in a metal ring that can be inserted into the enclosure.

10 Claims, 2 Drawing Sheets

ARRANGEMENT FOR VOLTAGE MEASUREMENT IN A GIS INSTALLATION

BACKGROUND OF THE INVENTION

1. Field of the Invention

The invention relates to an arrangement for voltage measurement in a gas-insulated switchgear having an isolated-phase bus, a current-carrying bus with a given external radius $R_1$ being arranged coaxially in a cylindrical enclosure with a given external radius $R_2$.

2. Discussion of Background

Conventional voltage and current measurement in gas-insulated switchgears, abbreviated to GIS installations, is normally done using inductive measuring transducers. A review of conventional metrology is given in the publication "Grundkurs der Messtechnik I" (Basic Metrology Course I), L. Merz, R. Oldenbourg Verlag, Munich - Vienna, 1968, pages 155 to 160.

In such applications, conventional sensors are very voluminous, something which is bound up not least with the necessary, complicated electrical isolation of the measuring transducer of the installation.

A large number of optical sensors for measuring electrical quantities such as current and voltage have recently been developed. Optical fiber sensors are particularly user-friendly in this regard. The following publications are important in this connection:

For voltage measurement:

EP 0,316,619 A1, K. Bohnert, J. Nehring: a selected directional component of an electric field is measured with the aid of the inverse piezoelectric effect.

For current measurement:

CH 659,329 A5, R. Dändliker: the Faraday effect caused by a current in a glass fiber is detected with the aid of a Sagnac interferometer.

Swiss Patent Application 3246/88-9, F. Maystre, A. Bertholds: the current sensor is a helical fiber, which goes round the current exactly once.

"Magneto-optical current transformer", A. Papp, H. Harms, Appl. Optics 19 (1980), page 3729: optical current sensor in accordance with the principle of the polarimetric method.

"Magneto-optic current sensing with birefringent fibers", S. C. Rashleigh, R. Ulrich, Appl. Phys. Lett. 34 (1979), page 768.

"Development of low- and high-birefringence optical fibers", D. A. Payne et al., IEEE J. of Quantum Electron. QE-18 (1982), page 477.

"The rotation of the polarization in low birefringence monomode optical fibers due to geometrical effects", J. N. Ross, Optical and Quantum Electronics 16 (1984), pages 455-461.

Nonconventional optical sensors offer a compact design and an inherent electrical isolation. In addition, they are largely insensitive to disturbing electrical and magnetic influences. For this reason, they are predestined for application in GIS installations. However, it has not so far been clear how optical sensors are advantageously to be integrated into a GIS installation.

SUMMARY OF THE INVENTION

Accordingly, one object of this invention is to provide a novel arrangement of the type mentioned at the beginning, which operates with nonconventional measuring transducers.

According to the invention, the object is achieved when an optical fiber voltage transducer having at least three identical piezoelectric sensor elements is provided, the piezoelectric sensor elements being arranged essentially at a distance corresponding to the internal radius $R_2$ from an axis of the bus in the enclosure at identical angular distances.

The advantage of the arrangement according to the invention resides in that a high measurement accuracy is guaranteed since small displacements of the bus with respect to the enclosure (e.g. because of thermal deformations) are advantageously averaged out.

In accordance with an advantageous embodiment the at least three sensor elements are mounted on a separate metal ring, for example made of aluminum, that can be inserted into the enclosure and has an internal radius of the same size as the enclosure. A so-called separating ring is particularly well-suited as the metal ring. This has the advantage that the measuring arrangement is modular and can be installed without any problem in a GIS installation of known design.

The piezoelectric sensor elements preferably have the form of a disk, around which a glass fiber is wound. The crystallographic orientation of the piezoelectric material is fixed in this arrangement such that only one field component parallel to the disk normal leads to a change in length of the glass fiber. The disk is preferably made of quartz, a two-fold axis of rotation being parallel to an axis normal to the disk, hereinafer call the disk normal. The sensor is consequently optimized for the radial field component inside the enclosure. There is thus a simple and well-defined relationship between electrical field strength and sensor signal.

In order to protect the sensor elements against aggressive fissile products of the insulating gas that may occur, the sensor elements are preferably surrounded by a protective material.

In accordance with a preferred embodiment of the invention, for this purpose the quartz disks and the glass fibers are packed in a tube-like sheath, which is filled with pulverulent soda lime. $Al_2O_3$, which has the property of adsorbing HF, can additionally be added to the soda lime.

If the glass fiber is accommodated with the sections lying between the individual sensor elements in a groove along an outer surface of the metal ring, they can be effectively preserved from undesired corrosion.

An embodiment in which a current sensor is additionally placed in the metal ring is particularly preferred. For this purpose, a sensor fiber is wound onto a suitable plastic coil, which essentially has a radius corresponding to the internal radius of the enclosure. Said fiber is fixed in the metal ring. A suitable measuring unit determines the current on the basis of the phase difference between the left-handedly and right-handedly circularly polarized component of the laser light conducted in the sensor fiber. A highly compact measuring arrangement for voltage and current is made available in this way.

If the Faraday effect is measured polarimetrically, the technical demands on the optical fiber current transducer are relatively slight.

In a somewhat different embodiment, the sensor coil is located outside the metal ring. The reverse current cannot then flow through the metal ring, but must be conducted around the sensor coil. Corrosion problems can be avoided from the outset in this way.

Further advantageous embodiments follow from the totality of the dependent patent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
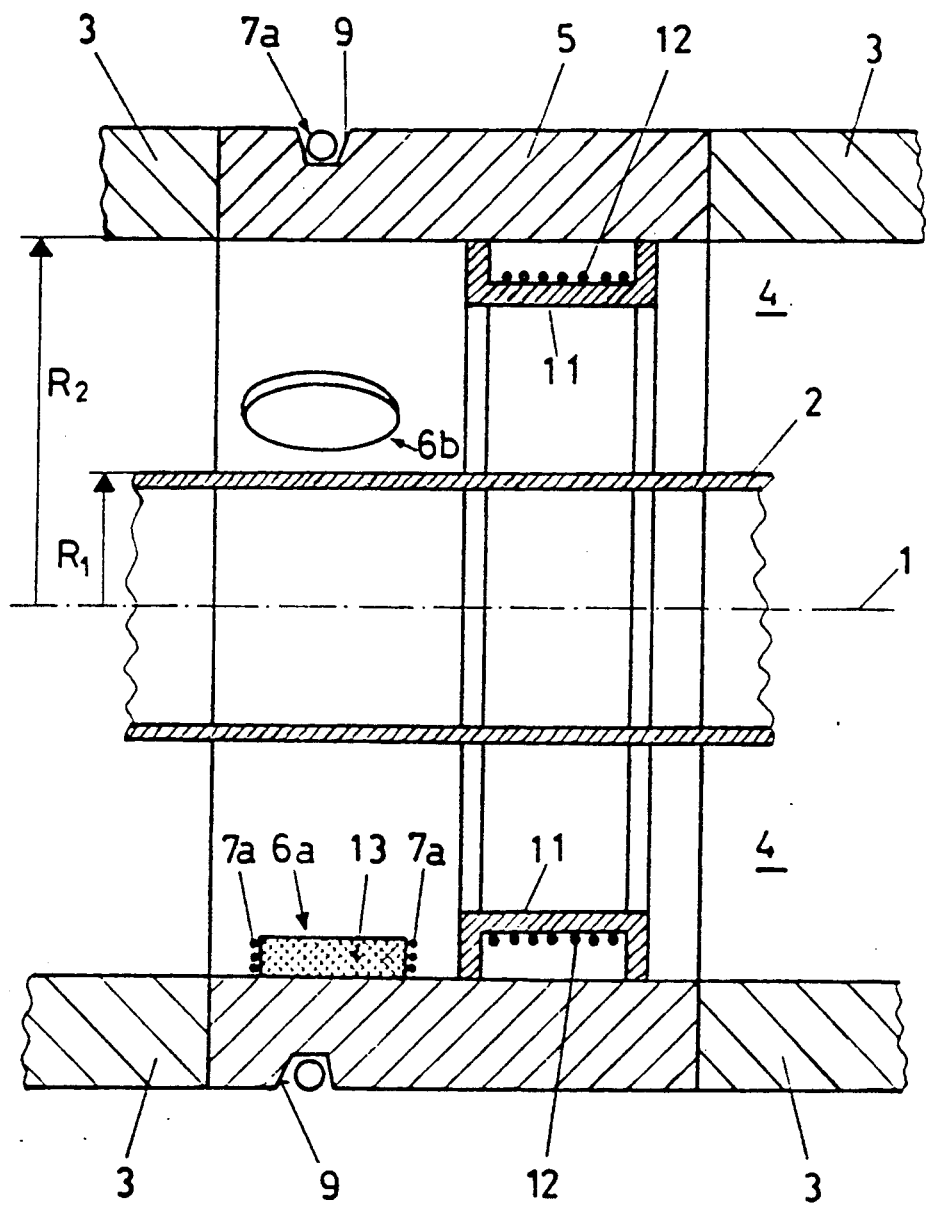
FIG. 1 shows an axial section through an arrangement for measuring voltage and current.

The reference symbols used in the drawings and their meaning are listed in summary in the list of designations.

DESCRIPTION OF THE PREFERRED EMBODIMENTS

Figure 2:
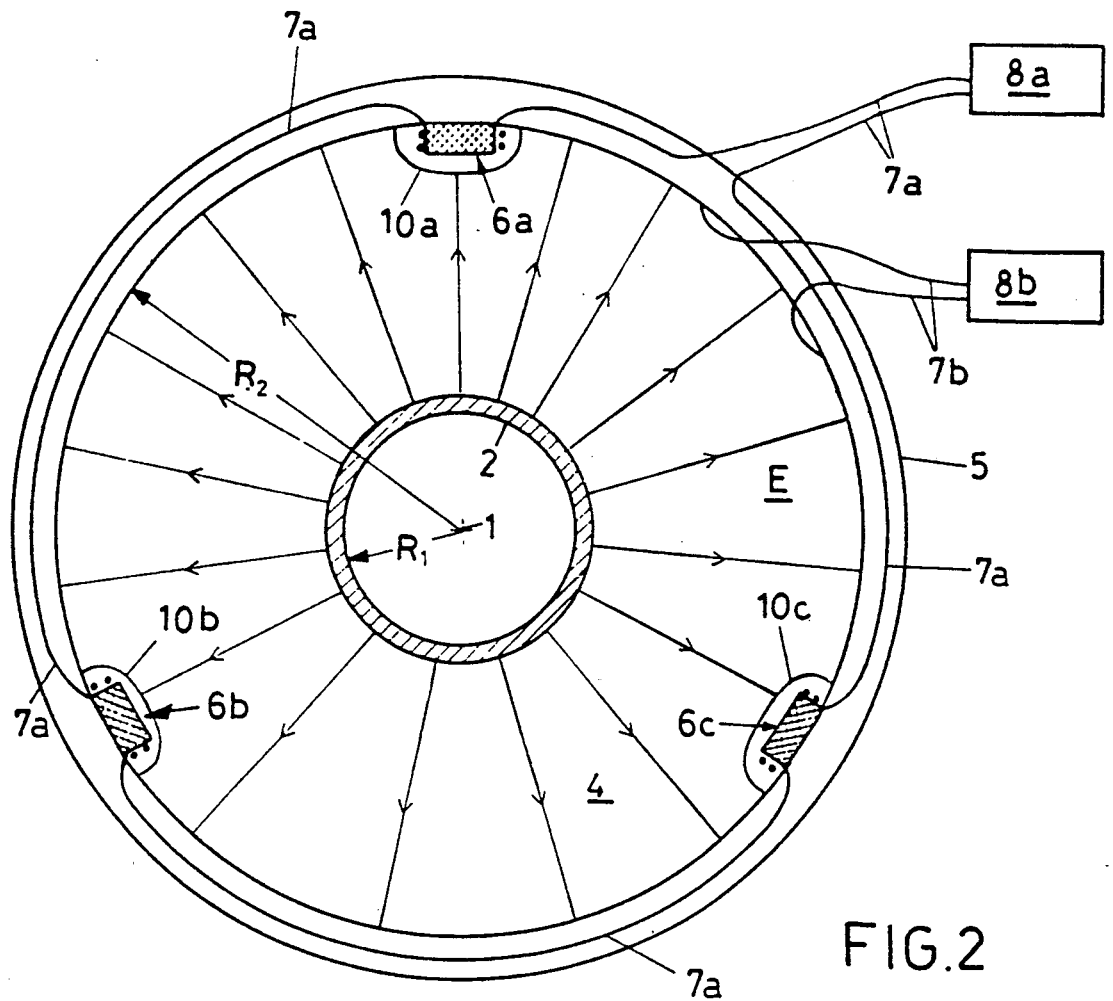
FIG. 2 shows a cross-section through an arrangement for voltage measurement.

Referring now to the drawings, wherein like reference numerals designate identical or corresponding parts throughout the several views, a particularly preferred embodiment of the invention is represented in FIGS. 1 and 2. In the case of this embodiment, both voltage and current are detected.

A current-carrying bus 2 with an external radius $R_1$ is arranged coaxially with an axis 1. A cylindrical enclosure 3, likewise coaxial with the axis 1, screens the bus 2 off from the outside. It has a given internal diameter $R_2$. An insulating gas 4, typically $SF_6$, is located in the gap between bus 2 and enclosure 3.

In accordance with a particularly preferred embodiment, a metal ring 5, which accommodates the optical sensors required for current and voltage measurement, is inserted into the enclosure 3. It preferably consists of aluminum, and for this reason it is easy to transport and install even given a large internal radius.

Three identical, piezoelectric sensor elements 6a, 6b, 6c are provided for voltage measurement. A sensor element 6a is shown in section in FIG. 1. A second is merely indicated. The sensor elements 6a, 6b, 6c are arranged at a distance from the axis 1, which essentially corresponds to the internal radius $R_2$. In the present example, they are mounted on the metal ring 5. They have identical angular distances from one another, that is to say 120° in the present embodiment.

The sensor elements 6a, 6b, 6c preferably have the form of a disk 13, around which a glass fiber 7a is wound. The disk 13 consists of a piezoelectric material, whose crystallographic orientation is fixed such that only a directional component of the electric field that is parallel to a disk normal is such as to lead to a change in circumference. The sensor elements 6a, 6b, 6c must thus point with their disk normal in the radial direction (with reference to the axis 1).

If the disk 13 consists of quartz, a two-fold crystallographic axis of rotation must be parallel to the disk normal.

The sensor elements 6a, 6b, 6c are connected in series. As an example, for this purpose a glass fiber 7a is fixed at distances forming three sections to three piezoelectric disks. The changes in circumference of the individual disks add up to a change in length of the glass fiber 7a. A measuring unit 8a couples laser light into the glass fiber 7a, and detects the periodic phase shift corresponding to the change in length of the glass fiber 7a caused by an alternating electric field E. Given ideal cylindrical symmetry, it is known that the following relationship holds between alternating electric field E and voltage U:

$$E = \frac{U}{R_2 \ln(R_2/R_1)} \quad (I)$$

E = electric field in the case of the sensor element (distance $R_2$)
U = voltage of the bus.

So that all sensor elements contribute with identical weighting to the total signal, they are to be identical both in their geometrical dimensions (diameter of the disk, number of windings of the glass fiber etc.) and also in their crystallographic orientation.

In accordance with an advantageous embodiment, the connecting glass fiber 7a is led in a groove 9 along an outer surface of the metal ring 5 from one sensor element to the next. In this way, the corroding influence of aggressive dissociation products of the insulating gas 4 can be kept small. Similarly, it is worth aiming to pack the sensor elements in suitable protective layers 10a, 10b, 10c to protect the sensor elements against any possible corrosion.

With $SF_6$ as insulating gas, $SF_4$, which leads in conjunction with water vapor to unpleasant hydrofluoric acid vapors, occurs as fissile product, for example. In this case, a protective layer 10a, 10b, 10c is indispensable, particularly for quartz. In accordance with a preferred embodiment of the invention, for this purpose the quartz disks and the glass fiber are packed into a tube-like sheath, which is filled with pulverulent soda lime. If, now, HF vapors should penetrate the sheath, they react with the soda lime, and unobjectionable NaF is produced. In addition, $Al_2O_3$, which has the property of adsorbing HF, can be added to the soda lime.

The measurement of electric fields by means of piezoelectric sensor elements is known per se from the patent application EP 0,316,619 A1 quoted at the beginning. In principle, all the piezoelectric sensors described there are suitable for the invention. However, preference is given to all plate-shaped and disk-shaped sensor elements which detect only a field acting perpendicular to the glass fiber. Such sensor elements have an advantageously small extent in the radial direction, and do not disturb the field distribution inside the enclosure.

In an arrangement according to the invention, a current sensor can additionally be integrated in an advantageous way. The essential point here is that an optical current sensor can be accommodated in the same metal ring without there being a substantial rise in the space requirement or the cost of installation.

For current measurement, use is made of the fact that the bus current to be measured generates a magnetic field, which acts via the Faraday effect on the laser light led into a sensor fiber. The Faraday effect is known to generate a phase shift $\delta$ between the right-handedly and left-handedly circularly polarized component of the laser light being led, which is given by:

$$\delta = 2 \, V \, N \, I \quad (II)$$

V = Verdet constant
N = number of windings of the sensor fiber around the bus
I = current in the bus.

The additional integrated current sensor is illustrated in FIG. 1. A sensor fiber 12 with e.g. exactly N=3 windings is mounted onto a plastic coil 11. Such a sensor coil yields a current measurement that is essentially independent of the exact form of the windings and their position with respect to the bus. In terms of cross-section, the plastic coil 11 fits, with its flanges, exactly into the metal ring 5.

The laser light required is supplied by a measuring unit 8b and led away thereto by means of a suitable glass fiber 7b (FIG. 2), which is coupled to the sensor fiber (12). In accordance with a preferred embodiment, the measuring unit 8b evaluates a rotation of the polarization in accordance with the polarimetric method. Details on such a polarimetric measuring unit are to be found in the publication "Magneto-optical current transformer", A. Papp, H. Harms quoted at the beginning.

It is advantageous to provide the sensor fiber at one end with a mirror, so that only one glass fiber needs to be provided as a lead, and the laser light runs through the sensor fiber twice (there and back). Suitable arrangements for coupling the laser light into and out of the supplying glass fiber are very well known per se.

Instead of polarimetric detection, detection in accordance with the principle of the reciprocal Sagnac interferometer is also suitable. Such a current transducer is known, for example, from the patent CH-659,329 A5 quoted at the beginning. Apart from a sensor fiber wound to a sensor coil, it comprises noise-free, optical fiber leads, and a measuring unit for interferometric detection (e.g. heterodyne detection) for measurement of the phase shift δ.

A central element of each optical fiber current transducer is the sensor fiber, which is wound to a sensor coil. It must exactly fulfill defined conditions. The following types, in particular, are suitable as the sensor fiber for the invention:

glass fibers with a low linear birefringence (see e.g. the publication by R. C. Rashleigh mentioned at the beginning). This is firstly twisted mechanically, and then loosely wound onto the plastic coil.

glass fibers with a high intrinsic birefringence (see e.g. the publication by D. A. Payne et al. mentioned at the beginning). In the case of this glass fiber, the optical axis of the linear birefringence rotates uniformly along the glass fiber. It is wound loosely onto the plastic coil.

glass fibers, in which the light is led on a helix (see e.g. the publication by J. N. Ross mentioned at the beginning). The glass fiber is wound once onto the plastic coil.

A further possibility for current measurement is represented by the use of a current transducer of the Fabry-Perot optical fiber type, such as is known, e.g., from the publication by F. Maystre, A. Bertholds (see the quotation with reference to the prior art). The characteristic of such a current transducer is a sensor fiber in the form of a helix which goes around the bus exactly once, and has a helix angle of approximately 30°. It is clear that, as a rule, this embodiment takes up more room in the axial direction than normal sensor coils.

After this overview of the current transducers which are suitable for the invention but known per se, a few further embodiments of the invention are additionally to be described in brief.

The sensor fiber of the current transducer need not unconditionally e wound onto a plastic coil, nor be accommodated inside the metal ring or the enclosure. Under certain circumstances it is also possible to wind the sensor fiber outside the enclosure, i.e. around the latter.

Figure 3:
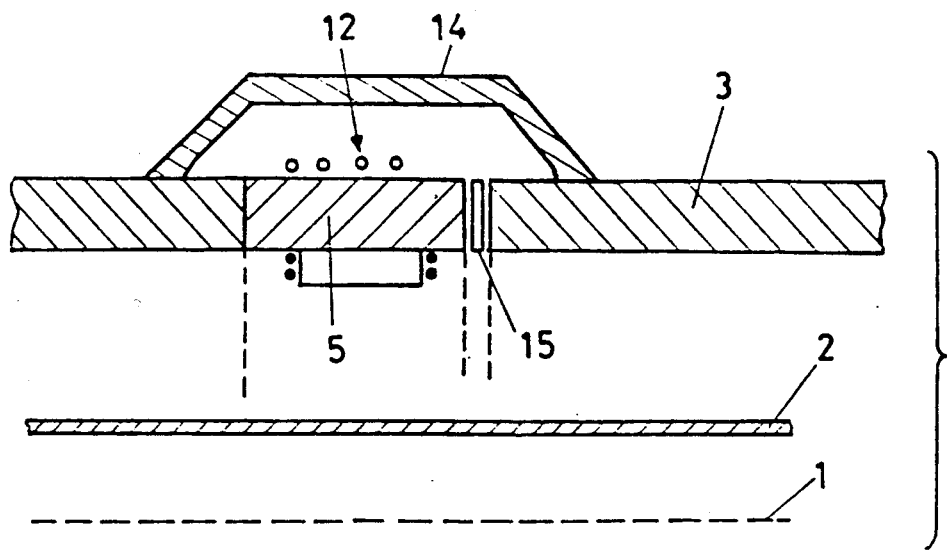
FIG. 3 shows an axial section through an arrangement for measuring current and voltage, in which the sensor column for current measurement is arranged outside the enclosure.

FIG. 3 shows a corresponding embodiment. A sensor fiber 12 is wound around the outside of the metal ring 5 to a sensor coil. An insulating ring 15 is inserted between the metal ring 5 and the enclosure 3. In addition, at least one conductor 14 is provided, which leads the reverse current outside around the sensor fiber 12. The metal ring 5 is possibly kept at ground potential by means of a suitable connection, in order to maintain reliable voltage measurement.

In this way, it can be avoided from the outset that the sensor fiber can be attacked by any sort of aggressive fissile products of the insulating gas. A precondition for this embodiment is that the reverse current normally flowing in the enclosure cannot flow inside the sensor coil, but is led around outside via one or more suitable conductors.

Instead of a separate metal ring, an already existent separating ring of the housing of the GIS installation can also be converted for the purpose of the invention. Such separating rings are required as connections between the individual tubes of the enclosure.

The following may be said about the number of the piezoelectric sensor elements employed. For economic reasons, it is desirable to keep the number as low as possible. In general, three sensor elements, arranged at 120° distances, suffice. Such an embodiment is therefore particularly preferred. If, however, the fields to be detected are relatively weak, the sensitivity of the voltage transducer can be improved by increasing the number. 6 sensor elements, e.g., have been employed with success for laboratory purposes.

With a view to a required redundancy or to a limited error compensation, the invention can, e.g., also comprise two voltage transducers and two current transducers. In this case, the piezoelectric sensor elements of the two voltage transducers, of which there are, for example, three each, are preferably arranged on the metal ring rotated by an angle of 60° with respect to one another. Depending upon the redundancy requirements, the electronics (measuring units) can be embodied singly (with appropriate supplements) or likewise doubly.

Finally, it can be stated that the invention creates an arrangement for monitoring voltage and preferably also current in a GIS installation, which has a very compact design, inherent electrical isolation of the sensor system from the measuring station, immunity from electromagnetic interference, and a greater compatibility with modern signal transmission systems and signal processing systems.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. An arrangement for voltage measurement in a gas-insulated switch gear having an isolated-phase bus, wherein a current-carrying bus with a given external radius $R_1$ and a first axis is arranged coaxially in a cylindrical enclosure with a given internal $R_2$, said arrangement comprising:

at least three identical piezoelectric sensor elements, each having a second axis, and each changing it outer dimensions, if an electric field is applied along said second axis;

at least one glass fiber with a certain length, said glass fiber being wound around and fixed to said piezoelectric sensor elements, such that a change in said outer dimensions of said piezoelectric sensor elements leads to a change is said length of said at least one glass fiber;

means for measuring said change in said length of said at least one glass fiber; and said piezoelectric sensor elements having essentially a distance from said first axis corresponding to said internal radius $R_2$, whereby each of said piezoelectric sensor elements is oriented with said second axis in a radial direction with regard to said first axis.

2. The arrangement as claimed in claim 1, wherein:
said at least three piezoelectric sensor elements are mounted at identical angular distances around said first axis on the inside of a separate metal ring that can be inserted into said enclosure.

3. The arrangement as claimed in claim 2, wherein:
sections of said glass fiber lying between said piezoelectric sensor elements are accommodated in a groove along an outer surface of said metal ring.

4. The arrangement as claimed in claim 1, wherein:
said at least three piezoelectric sensor elements each have the form of a disk having said second axis normal to the disk, said disks arranged at identical angular distances on a circle around said first axis; and said sensor elements consist of a piezoelectric material whose crystallographic orientation is such that only an electric field component parallel to said second axis of each disk leads to a change in said length of said at least one glass fiber.

5. The arrangement as claimed in claim 4, wherein:
said piezoelectric material is quartz; and
a two-fold axis of rotation is parallel to said second axis.

6. The arrangement as claimed in claim 1 wherein:
exactly three piezoelectric sensor elements are provided and arranged at identical angular distances on a circle around said first axis; and
said piezoelectric sensor elements are connected in series.

7. The arrangement as claimed in claim 1 further comprises an optical fiber current transducer for measuring a current flowing in said current carrying bus, said current transducer comprises a sensor fiber having plural windings arranged coaxially with said current carrying bus, and said piezoelectric sensor elements are arranged at identical angular distances on a circle around said first axis.

8. The arrangement as claimed in claim 7, wherein said current transducer comprises:
a measuring unit which detects the Faraday effect within said sensor fiber polarimetrically.

9. The arrangement as claimed in claim 7, wherein;
said sensor fiber surrounds said enclosure on its outside; and
said sensor fiber is surrounded on its outside by additional conductors which are in contact with said enclosure on both sides of said sensor fiber and leas a reverse current flowing in said enclosure outside around said sensor fiber.

10. The arrangement as claimed in claim 7, wherein said sensor fiber comprises:
a exactly N winding wound around an isolating ring, N being a positive whole number.

* * * * *